(12) United States Patent
Fan

(10) Patent No.: US 8,901,994 B2
(45) Date of Patent: Dec. 2, 2014

(54) DIGITALLY SWITCHED CAPACITOR LOOP FILTER

(75) Inventor: Yongping Fan, Portland, OR (US)

(73) Assignee: Intel Coproration, Santa Clara, CA (US)

( * ) Notice: Subject to any disclaimer, the term of this patent is extended or adjusted under 35 U.S.C. 154(b) by 0 days.

(21) Appl. No.: 13/997,645

(22) PCT Filed: Dec. 30, 2011

(86) PCT No.: PCT/US2011/068241
§ 371 (c)(1),
(2), (4) Date: Jun. 24, 2013

(87) PCT Pub. No.: WO2013/101231
PCT Pub. Date: Jul. 4, 2013

(65) Prior Publication Data
US 2014/0218082 A1    Aug. 7, 2014

(51) Int. Cl.
*H03K 5/00* (2006.01)
*H03L 7/093* (2006.01)
(52) U.S. Cl.
CPC ..................................... *H03L 7/093* (2013.01)
USPC .......................................... 327/554; 327/157
(58) Field of Classification Search
USPC ........................... 327/552, 558, 554, 148, 157
See application file for complete search history.

(56) References Cited

U.S. PATENT DOCUMENTS

| 5,656,975 A | 8/1997 | Imura |
| 5,889,439 A | 3/1999 | Meyer et al. |
| 5,942,949 A | 8/1999 | Wilson et al. |
| 6,600,351 B2 * | 7/2003 | Bisanti et al. ................. 327/157 |
| 6,861,898 B2 * | 3/2005 | Hsu et al. ...................... 327/552 |
| 7,019,571 B2 | 3/2006 | Lim |
| 8,704,564 B2 * | 4/2014 | Hasegawa et al. ............ 327/156 |

OTHER PUBLICATIONS

PCT Notification of Transmittal of the International Search Report and the Written Opinion of the International Searching Authority, or the Declaration for PCT Counterpart Application No. PCT/US2011/068241, 9 pgs., (Sep. 10, 2012).

\* cited by examiner

*Primary Examiner* — Hai L Nguyen
(74) *Attorney, Agent, or Firm* — Blakely, Sokoloff, Taylor & Zafman LLP

(57) ABSTRACT

A loop filter is described. The loop filter has first and second inputs and an output. A loop filter capacitor is coupled to the loop filter output. Sample switches are coupled to the second loop filter input. A voltage divider is coupled to reset switches. Switched capacitors are coupled to sample switches, the reset switches, the loop filter capacitor, and the loop filter output.

18 Claims, 9 Drawing Sheets

100

DIGITALLY SWITCHED CAPACITOR LOOP FILTER

CROSS-REFERENCE TO RELATED APPLICATION

This patent application is a U.S. National Phase Application under 35 U.S.C. §371 of International Application No. PCT/US2011/068241, filed Dec. 30, 2011, entitled DIGITALLY SWITCHED CAPACITOR LOOP FILTER.

FIELD

Embodiments of the present invention relate to an electronic filter for a phase lock loop circuit. In particular, embodiments of the present invention relate to a switched capacitor loop filter that uses a voltage divider and digital gates to control the charging and discharging of capacitors.

BACKGROUND

A prior art phase lock loop ("PLL") circuit (also referred to as a phase-locked loop circuit) typically includes a phase detector, a filter, and a variable frequency oscillator, the latter of which typically is a voltage-controlled oscillator. The phase detector detects a phase difference between a reference signal and a feedback signal from the variable frequency oscillator. The phase detector sends a signal to the oscillator via the filter in order to adjust the frequency of the oscillator such that phases of reference signal and the feedback signal match.

Phase lock loop circuits are typically used for electronics for signal recovery, signal stability, and signal generation, such as frequency synthesis. Phase lock loop circuits generate high speed clocks with low jitter for Peripheral Component Interconnect Express ("PCIe") devices, Quick Path Interconnect ("QPI") devices, and other high speed input-output ("IO") devices. Phase lock loop circuits are also used for radio frequency ("RF") integrated circuit ("IC") chips.

The filter in a prior art phase lock loop circuit is typically called a loop filter. The filter typically is a low-pass filter. The filter typically helps the phase lock loop circuit better handle changes, such as changes to the reference frequency, changes in the feedback signal, and changes at startup. The filter helps to determine lockup time and damping. The filter also helps to limit the amount of frequency ripple between the output of the phase detector and the input of the oscillator.

A resistor-capacitor ("RC") loop filter has been used extensively in the prior art in phase lock loop designs. One disadvantage of a conventional RC loop filter is that in 32 nanometer ("nm") metal gate complementary metal-oxide semiconductor ("CMOS") logic technology, an RC loop filter typically cannot meet tight PLL bandwidth and jitter peaking specifications, such as for PCIe generations 2 and 3. One reason is the resistor variation across process, voltage, and temperature ("PVT").

For a conventional RC loop filter, the voltage drop on the resistor (the proportional control term) typically has a fixed magnitude of Vprop=R·Icp and a varying pulse width. The pulse width is the phase difference (also called phase error) between the reference clock and the feedback clock. Given this, another disadvantage of a conventional RC loop filter is that given that the phase error does not drop to zero in the PLL locked condition due to leakage current and mismatches, there typically will be a chain of narrow pulses of voltage Vprop superimposed on the control voltage Vct1. These periodic narrow voltage pulses typically cause systematic jitter in the output clock at the reference clock period. In the frequency domain, this periodic variation in clock period is called a reference spur.

FIG. 1 shows the design of an example of a prior art switched capacitor loop filter 10. Capacitors 2 and 3 are typically reset to an inductor capacitor voltage-controlled oscillator ("LC-VCO") control voltage that is generated by a unit gain buffer 5. Unit gain buffer 5 is an analog circuit that typically requires the prior art switched capacitor loop filter 10 to have a high open loop gain and a low input offset at the differential inputs.

A disadvantage of the prior art switched capacitor loop filter 10 is that as process scaling gets to a 32 nm node and below, it typically is very difficult to design the loop filter to have high gain and a low input offset differential amplifier without supporting circuits that increase the area of the loop filter and raise power consumption. Such supporting circuits typically include analog bias generators, circuitry for an external reference current, and circuitry for offset cancellation.

Another disadvantage of the prior art loop filter 10 is that the charge pump capacitor 1 is typically relatively large—for example, 7 picofarads ("pF"). The charge pump capacitor 1 typically determines the loop bandwidth and jitter peaking of loop filter 10.

BRIEF DESCRIPTION OF THE DRAWINGS

Embodiments of the present invention are illustrated by way of example and not limitation in the figures of the accompanying drawings, in which like references indicate similar elements.

DETAILED DESCRIPTION

An embodiment of the present invention is a digitally switched capacitor loop filter for a phase lock loop circuit. The digitally switched capacitor loop filter uses digital devices and no analog unity gain buffer is required. The loop filter has first and second inputs and an output. A loop filter capacitor is coupled to the loop filter output. Sample switches are coupled to the second loop filter input. A voltage divider is coupled to reset switches. Switched capacitors are coupled to sample switches, the reset switches, the loop filter capacitor, and the loop filter output.

The design of the digitally switched capacitor loop filter is amenable to advanced semiconductor process technology, including scaling to 32 nanometers and below. Using a digitally switched capacitor loop filter of an embodiment of the invention in an inductive capacitive ("LC") phase lock loop circuit helps to avoid the need for a high open loop gain amplifier. As a result, the digitally switched capacitor loop filter of an embodiment of the invention helps to avoid the use of long channel analog devices. The design of an embodiment of the invention may help to reduce power consumption and chip area. The digitally switched capacitor may help to reduce capacitor area and total capacitance required. An embodiment of the present invention may also help to reduce design and manufacturing costs.

Figure 1:
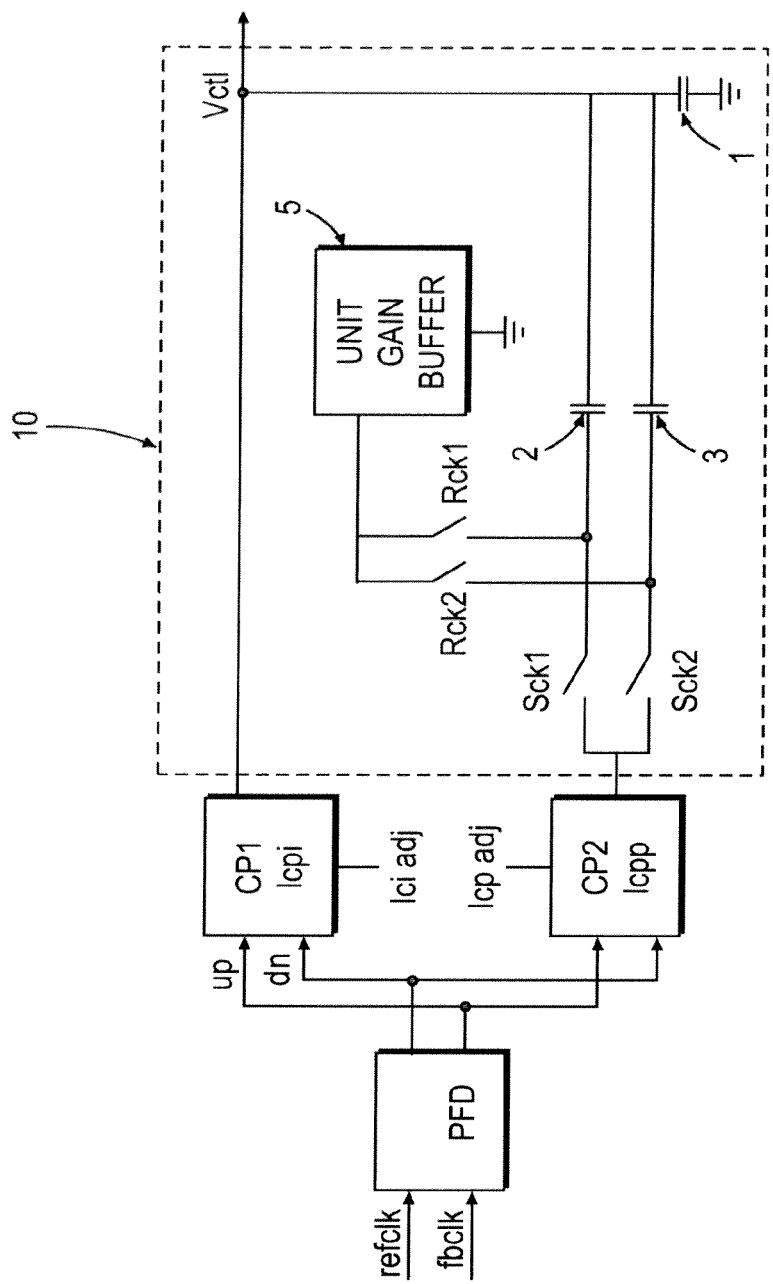
FIG. 1 illustrates a prior art switched capacitor loop filter.
Figure 2:
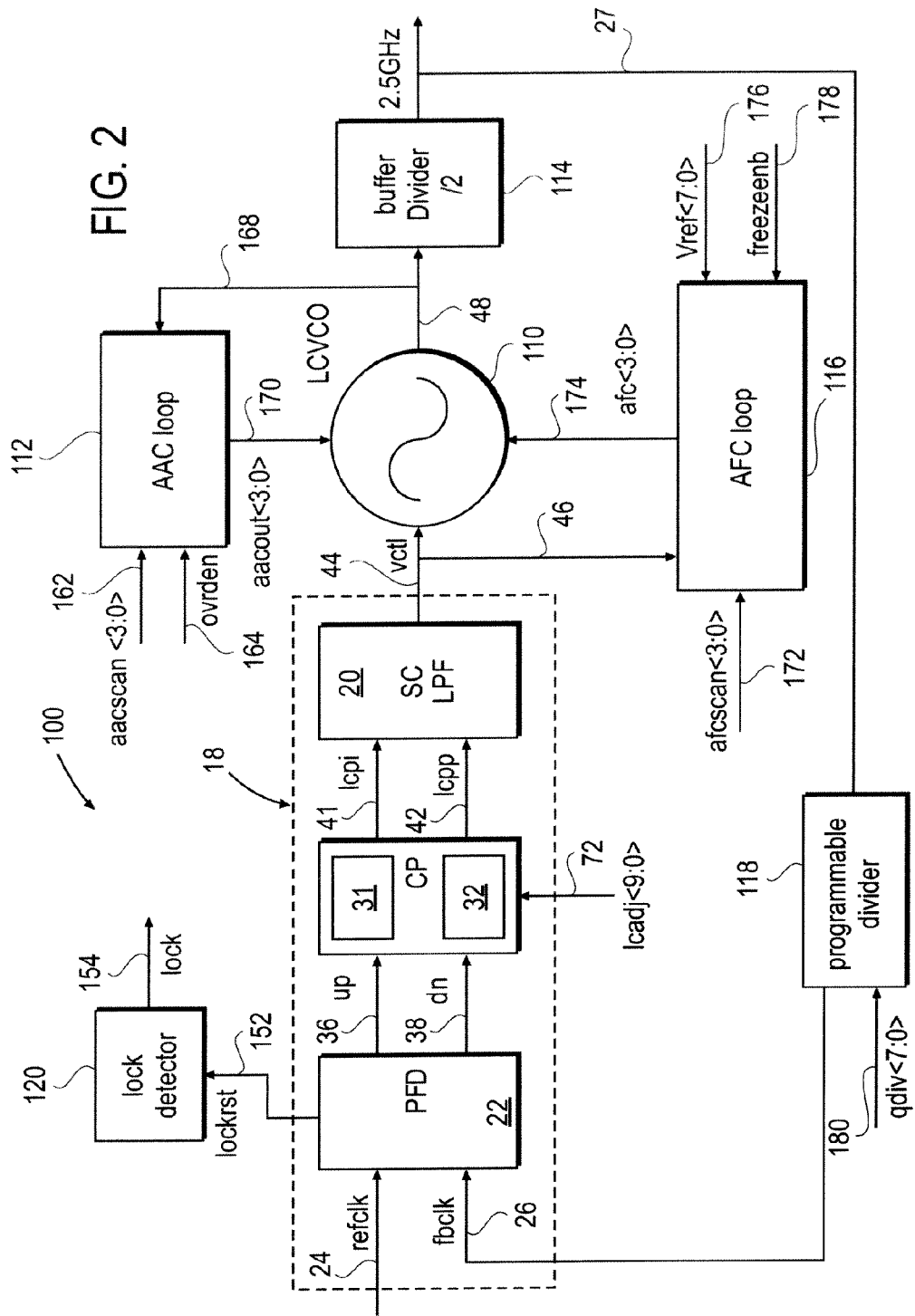
FIG. 2 illustrates an inductor capacitor ("LC") phase lock loop circuit employing an embodiment of a digitally switched capacitor loop filter.

FIG. 2 is a block diagram of an embodiment of an inductive capacitive phase lock loop ("LC-PLL") circuit 100. For one embodiment, the phase lock loop circuit 100 includes a digitally switched capacitor loop filter 20. For one embodiment, the phase lock loop circuit 100 is used for a PCIe generation 2 high-speed input-output link for a digital system. The phase lock loop circuit 100 includes a phase frequency detector 22, two charge pumps 31 and 32, a switched capacitor loop filter 20, a inductive capacitive voltage controlled oscillator ("LC-VCO") core 110, a mixed signal automatic frequency calibration ("AFC") loop controller 116, a digital automatic amplitude calibration ("AAC") controller loop 112, a programmable divider 118, and a 50% duty cycle divide by 2 buffer circuit 114. A lock detector 120 is also included within the phase lock loop circuit 100.

Block 18 of phase lock loop circuit 100 includes the phase frequency detector 22, the charge pumps 31 and 32, and the switched capacitor loop filter 20. The phase frequency detector 22 receives a reference clock 24, which the phase frequency detector 22 compares with a feedback clock 26. The feedback clock 26 is received from the LC-VCO 110 via the buffer divider circuit 114 and the programmable divider 118. The phase frequency detector 22 generates a pulse width (up or down) that is proportional to the phase difference between the reference clock ("refclk") 24 and the feedback clock ("fdclk") 26. The up pulse is sent by phase detector 22 to charge pumps 31 and 32 via line 36. The down pulse is sent on line 38 to charge pumps 31 and 32 from phase frequency detector 22.

The pulse width up turns on charging-up current to the switched capacitor loop filter 20. The pulse width down signal turns on charging-down current to the switched capacitor loop filter 20.

The output of charge pump 31 is signal Icpi sent on line 41 to switched capacitor loop filter 20. The output of charge pump 32 is signal Icpp sent on line 42 to switched capacitor loop filter 20. The adjustment signal Icadj is sent to adjust the charge pumps 31 and 32 via line 72.

Switched capacitor loop filter 20 generates a control voltage (Vct1), which is sent on line 44 to LC-VCO 110. The control voltage Vct1 is the output from the switched capacitor loop filter. The control voltage Vct1 is also sent to the AFC loop 116 via line 46.

The control voltage Vct1 on line 44 adjusts the oscillating frequency of the LC-VCO 110. The output of the LC-VCO 110 is sent via line 48 to the buffer divider circuitry 114. The output of the buffer divider 114 is sent via line 27 to programmable divider 118. The output of programmable divider 118 in turn produces the feedback clock 26 that is sent to the phase frequency detector 22.

The LC-VCO 110 can oscillate at various frequencies. In addition, the reference clock on line 24 can be various frequencies. One example of many possible frequencies is as follows. If the reference clock is at 100 megahertz and the LC-VCO is oscillating at 5 gigahertz, then the divide ratio is 50, which would include a divide by 2 provided by the buffer divider circuitry 114 and a divide by 25 provided by the programmable divider 118.

An automatic frequency calibration algorithm is implemented by circuitry 116. An automatic amplitude calibration algorithm is implemented by circuitry 112. The automatic frequency calibration algorithm and the automatic amplitude calibration algorithm are implemented to realize a wide frequency lock range and to maintain the optimum oscillation amplitude under process, supply voltage, and temperature variations.

The automatic frequency control circuitry 116 receives an input afcscan on line 172, an input Vref on line 176, and an input freezeenb on line 178. The automatic frequency calibration loop circuitry 116 provides an output afc on line 174 that is sent to the LC-VCO 110.

The automatic amplitude calibration circuitry 112 receives an input aacscan on line 162, an input ovrden on line 164, and an input on line 168 received as an output of the voltage controlled oscillator 110. The automatic amplitude calibration circuitry 112 provides an output signal aacout on line 170, which is sent as an input to the voltage-controlled oscillator 110.

The phase lock loop circuitry 100 includes lock detector circuitry 120 that generates an output signal called lock on line 154 that indicates a lock condition. Lock detector circuitry 120 receives an input signal lockrst on line 152. Phase frequency detector 22 sends the lockrst signal to lock detector 120 on line 152 when the feedback clock signal on line 26 is the same frequency as the reference clock signal refclk on line 24.

Figure 3:
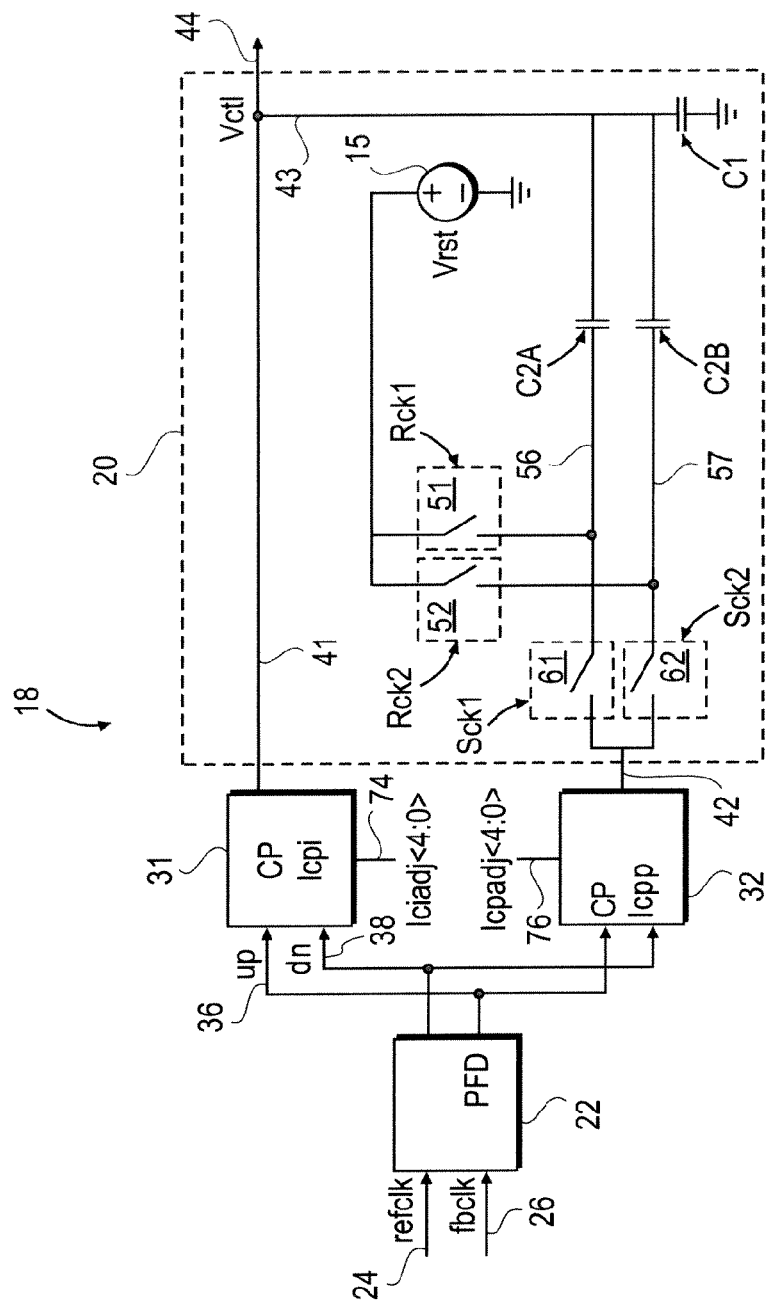
FIG. 3 illustrates an embodiment of a digitally switched capacitor loop filter along with a phase detector and charge pumps.

FIG. 3 illustrates circuitry 18, which includes digitally switched capacitor loop filter 20, charge pumps 31 and 32, and phase frequency detector 22. Loop filter 20 includes switched capacitors C2A and C2B, loop filter capacitor C1, reset voltage generator 15, reset switches 51 and 52, and sample switches 61 and 62. For one embodiment, capacitors C2A and C2B are of equal size and each have the same capacitance value, herein designated as C2. For one embodiment, C2 equals 3 picofarads ("pF"). For one embodiment, the capacitance of capacitor C1 is 4 pF.

Phase frequency detector 22 determines the phase difference between the reference clock on line 24 and the feedback clock on line 26. The phase frequency detector 22 generates a pulse width that is proportional to the phase difference between the reference clock refclk on line 24 and the feedback clock fbclk on line 26. An up pulse is provided on line 36 and sent to charge pumps 31 and 32. A down pulse is sent from phase frequency detector 22 on line 38 to charge pumps 31 and 32. Integrated charge pump 31 receives as inputs the up pulse on line 36 and the down pulse on line 38. Proportioned charge pump 32 receives as inputs the up pulse on line 36 and the down pulse on line 38.

An up pulse provided as an input on line 36 to integral charge pump 31 results in a positive output current Icpi on line 41 from integral charge pump 31. A down pulse on line 38 applied as an input to integral charge pump 31 results in a negative output current Icpi on line 41. An up pulse on line 36 applied as an input to proportional charge pump 32 results in a positive output current Icpp on line 42 from charge pump 32. A down pulse on line 38 applied as an input to proportional charge pump 32 results in a negative output current Icpp on line 42.

Input current Iciadj is applied on line 74 as an input to integral charge pump 31 in order to fine tune and adjust the performance of charge pump 31. Input current Icpadj is applied on line 76 as an input to proportional charge pump 32 in order to fine tune and adjust the performance of charge pump 32.

In each reference clock cycle, integral charge pump 31 charges loop capacitor C1 via lines 41 and 43 for a time equal to the phase difference between the reference clock refclk and the feedback clock fbclk. Proportional charge pump 32 charges capacitor C1 through capacitors C2A and C2B alternately for the same amount of time (i.e., the time equal to the phase difference between the reference clock and the feedback clock). The output of proportional charge pump 32 is sent via line 42 to sample switches 61 and 62. When sample switch 61 is closed, the signal from charge pump 32 proceeds via line 56 to capacitor C2A. Similarly, when switch 62 is closed, the output signal from charge pump 32 is sent via lines 42 and 57 to capacitor C2B. Capacitors C2A and C2B are in turn coupled to capacitor C1. Switches 61 and 62 are opened and closed alternately. That means that when switch 61 is closed, switch 62 is open. Likewise, when switch 61 is open, switch 62 is closed.

Reset voltage Vrst is generated by voltage generator 15. For one embodiment of the invention, reset voltage Vrst is generated by resistor divider circuit 15 shown in FIG. 4. For one embodiment, resistive voltage divider 15 is comprised of resistors 201-206. Resistors 201-206 are wired in series, and various voltages are generated at tap points in the resistor chain.

For one embodiment of the invention, the resistive voltage divider 15 is implemented in integrated circuits without the use of traditional discrete resistors. Instead, the resistance values of the integrated circuits are chosen to form a circuit in the form of resistive divider 15.

For one embodiment of the invention, the value of the reset voltage Vrst is chosen to be Vrst3. For one embodiment of the invention, the value of Vrst3 is one half of the reference voltage Vcc. Other embodiments of the present invention use other values for the reset voltage.

The reset voltage Vrst generated by the divider circuit 15 is applied alternately to capacitors C2A and C2B via respective reset switches 51 and 52 and lines 56 and 57, which are shown in FIG. 3.

Reset switch 51 is controlled by digital reset clock Rck1. Reset switch 52 is controlled by digital reset clock Rck2. Sample switch 61 is controlled by digital sample clock Sck1. Sample switch 62 is controlled by digital sample clock Sck2. Each one of the clocks Sck1, Sck2, Rck1, and Rck2 is set to a frequency that is one half the frequency of the reference clock 24. The phases of the clocks Sck1, Rck1, Sck2, and Rck2 are arranged such that in reference clock cycle N, capacitor C2A is charged while capacitor C2B is reset to the reset voltage Vrst. This reset to Vrst discharges the charge Qp from capacitor C2B from the last cycle. In reference clock cycle N+1, capacitor C2B is charged while capacitor C2A is reset to reset voltage Vrst.

Figure 4:
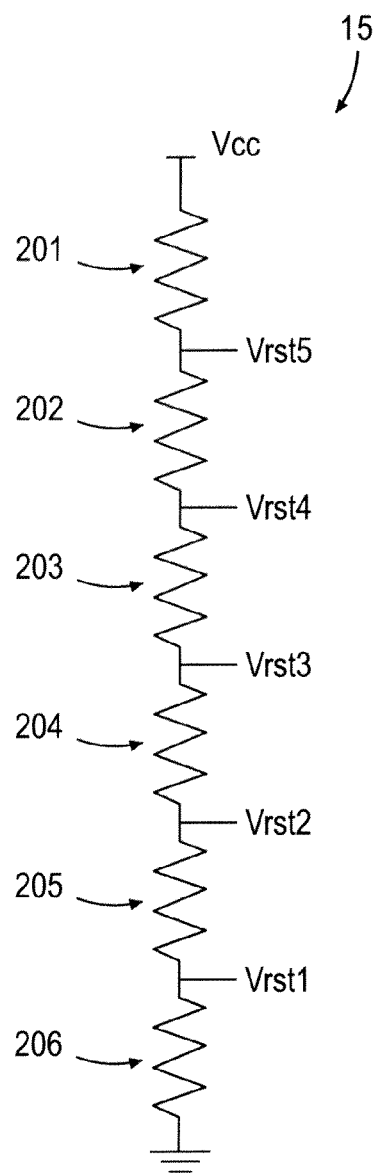
FIG. 4 illustrates a resistor divider circuit for generating a reset voltage.

As discussed above, the reset voltage Vrst can be generated by the resistor divider 15 shown in FIG. 4. The output of the resistor divider circuit 15 is a divided voltage that is independent of resistor value variation across process and temperature. The reset voltage Vrst is selected to be close to the control voltage Vct1 at lock condition (of the phase lock loop) in order to minimize the residual charge on capacitors C2A and C2B. This helps to minimize the residual voltage drop on capacitors C2A and C2B, so that charge pump current source devices operate in deep saturation mode across process, voltage, temperature, and frequency changes.

The output from the digitally switched capacitor loop filter 20 is control voltage Vct1 that is sent via line 44 to the LC-VCO 110 of FIG. 2. Loop filter 20 thus provides a filtered voltage Vct1 that controls voltage-controlled oscillator 110.

Figure 5:
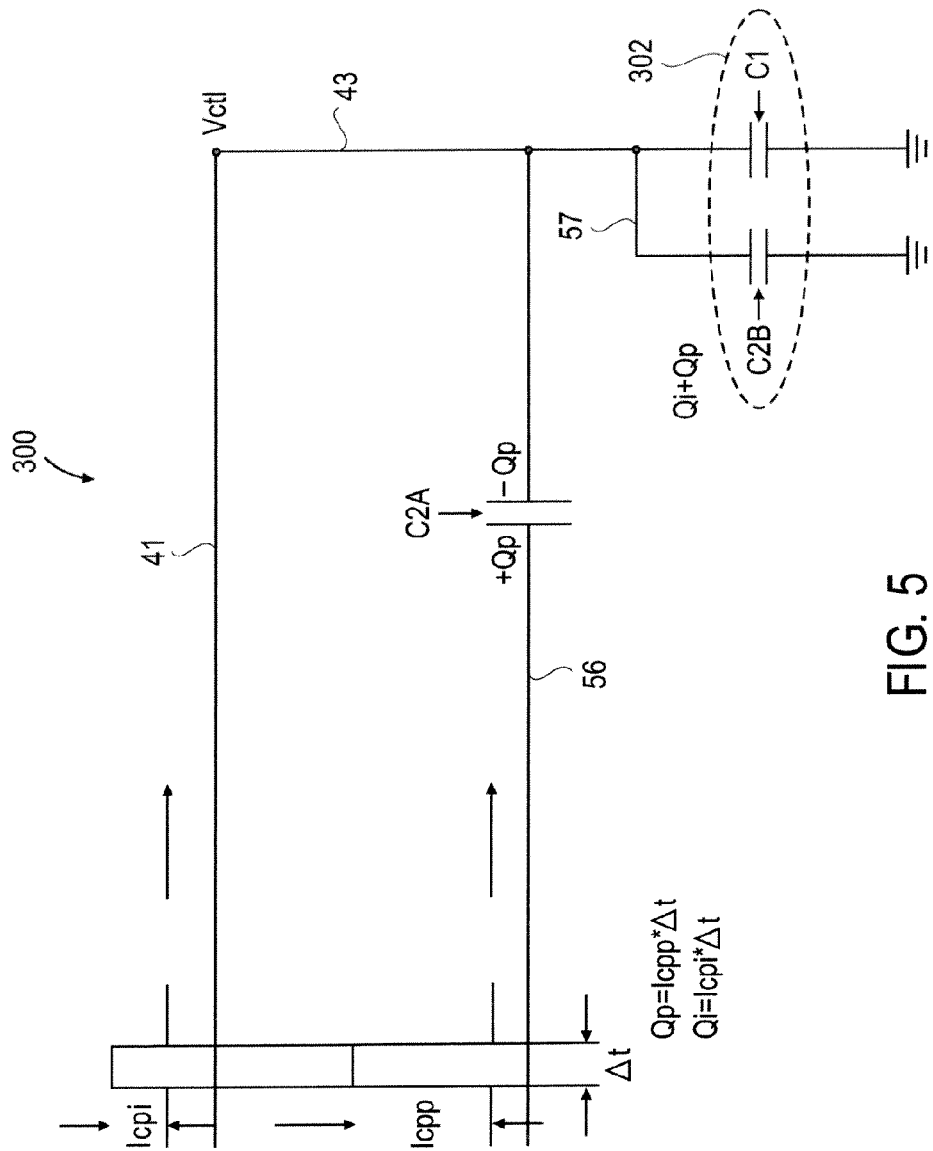
FIG. 5 shows an equivalent circuit showing charging through a capacitor during a cycle.

FIG. 5 shows the equivalent circuit 300 showing charging in the switched capacitor loop filter 20 in clock cycle N. Integral charge pump 31 provides an output current Icpi on line 41. In clock cycle N, output current Icpi charges capacitors C2B and C1 directly. Current Icpp is the output current of proportional charge pump 32. In clock cycle N, the output current Icpp charges capacitors C1+C2B through capacitor C2A. Therefore, in clock cycle N, the loop filter capacitance of the loop filter 20 is effectively the capacitance of capacitor C1+C2B.

Figure 6:
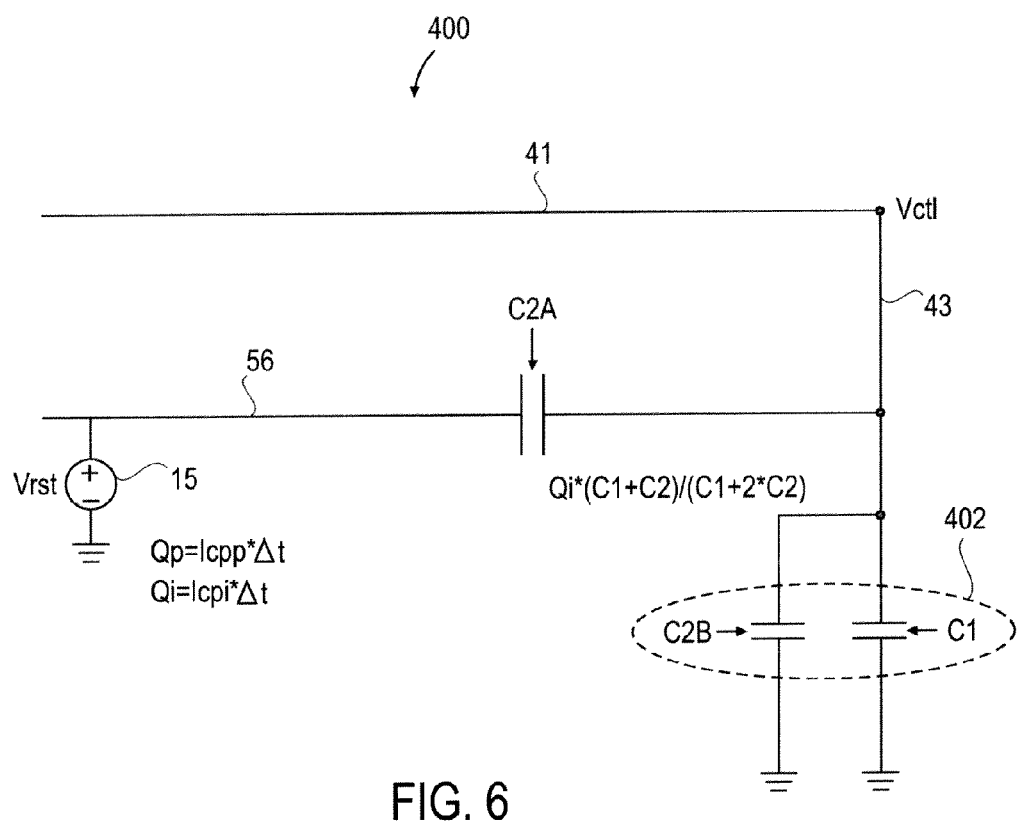
FIG. 6 shows an equivalent circuit showing resetting of charge through a capacitor during a cycle.

FIG. 6 shows the charge reset alternating current equivalent circuit 400 of loop filter 20 in cycle N of the clock cycle. During the reset operation, both charge pumps 31 and 32 are open (i.e., off), switch 51 (controlled by reset clock Rck1) is closed, and capacitor C2A is connected to the DC voltage Vrst supplied by the voltage divider 15. It can be shown mathematically that the net charge left on capacitors C1+C2B (shown by area 402) after resetting is $Q_i*(C1+C2)/(C1+2*C2)$, wherein charge $Q_i = I_{cpi}*\Delta t$ is the charge injected from the integral charge pump 31 in cycle N.

Compared with an example of the prior art design for a loop filter, the integral charge pump current Icpi supplied by charge pump 31 is scaled by a factor of $(C1+C2)/(C1+2*C2)$, which is 0.7 for C1=4 pF and C2=4 pF. Because charge pump current Icpi is normally 50 microamps (µa) to 100 µa, the increase in current consumption is negligible compared with total LC-PLL current.

For clock cycle N+1, the integral charge pump current Icpi charges capacitors C1 and C2A directly, while proportional charge pump current Icpp charges capacitors C1 and C2A through capacitor C2B. Therefore, the loop filter capacitance of loop filter 20 is effectively C1+C2B. Because the capacitance of capacitors C2A and C2B each equals C2 (i.e., C2A=C2B=C2), capacitors C2A and C2B have become part of the overall loop filter capacitance of loop filter 20. Therefore, the size of capacitor C1 can be reduced to C1-C2.

For example, if in a prior art design, the capacitance of capacitor C1 equals 7 picofarads (i.e., C1=7 pF), and the capacitance of each capacitor C2A and C2B is 3 picofarads (C2=3 pF), then for an embodiment of the invention the capacitance of capacitor C1 can be 4 picofarads (C1=4 pF) and the capacitance of each of capacitors C2A and C2B can be 3 picofarads (C2=3 pF). The area saving in the loop filter capacitor C1 is about 42%. In addition, the total capacitor size in the loop filter 20 (i.e., C1+2*C2) is reduced by approximately 23%.

Figure 7:
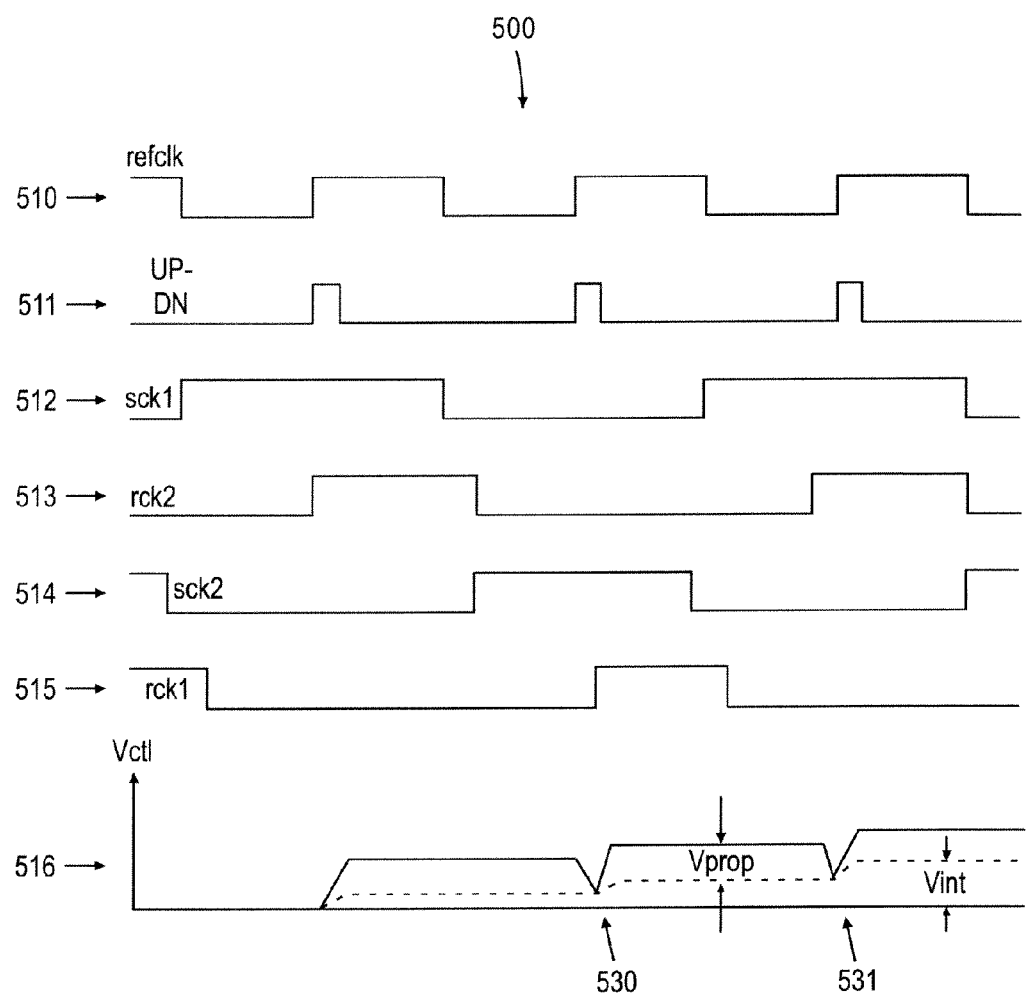
FIG. 7 shows sampling clock waveforms, resetting clock waveforms, and control voltage waveforms for an embodiment of a digitally switched capacitor loop filter.

FIG. 7 illustrates examples of waveforms 500 that show examples of the operation of circuitry 18 and switched capacitor loop filter 20. Waveform 510 represents the reference clock on line 24 applied to phase frequency detector 22. Waveform 511 represents the up and down signals on lines 36 and 38 applied to charge pumps 31 and 32. Waveform 512 represents the sample clock Sck1 that controls switch 61. Waveform 513 represents the reset clock Rck2 that controls reset switch 52. Waveform 514 represents the sample clock Sck2 that controls switch 62. Waveform 515 represents the reset clock Rck1 that controls reset switch 51. Waveform 516 shows the control voltage Vct1 versus time that is provided as a filter output from switched capacitor loop filter 20.

FIG. 7 shows the waveforms for the sample and reset clocks as well as the control voltage for the charging and resetting of capacitors C2A and C2B during the phase lock loop locking process. The injected charge on the loop filter capacitor C1 (when there is a phase error) is spread over a whole reference clock Refclk, so voltage ripples on the control voltage Vct1 are reduced to a minimum, especially as compared with that of a prior art resistive capactive loop filter.

Vprop is the voltage contribution from the proportional charge pump 32. Vint is the voltage contribution from the integral charge pump 31. The sum of the voltages Vprop and Vint is the control voltage Vct1 on line 44 provided as an output from the loop filter 20 and sent to the voltage-controlled oscillator 110 shown in FIG. 2.

Points 530 and 531 of control voltage waveform 516 are due to the resetting process. For example, point 530 is caused by the reset clock Rck1 closing switch 51 and applying the reset voltage to capacitor C2A. Point 531 is caused by the reset clock Rck2 closing switch 52 and applying the reset voltage Vrst to capacitor C2B.

The phase lock loop bandwidth and jitter peaking parameters can be optimized by choosing the values of C1 and C2, the current in charge pump 31 (Icpi), and the current in charge pump 32 (Icpp), as shown by the following equations for a closed loop transfer functions H(s), damping factor, natural frequency, and 3 dB loop bandwidth:

$$H(s) = \frac{\frac{K_{vco}I_{cpi}}{2\pi(C_1 + 2C_2)}\left(1 + \frac{T_{ref}I_{cpp}(C_1 + 2C_2)}{I_{cpi}(C_1 + C_2)}s\right)}{s^2 + \frac{K_{vco}T_{ref}I_{cpp}}{2\pi N(C_1 + 2C_2)}s + \frac{K_{vco}I_{cpi}}{2\pi N(C_1 + 2C_2)}}$$

$$\xi = \frac{1}{2}\frac{T_{ref}I_{cpp}(C_1 + 2C_2)}{I_{cpi}(C_1 + C_2)}\sqrt{\frac{K_{vco}I_{cpi}}{2\pi N(C_1 + 2C_2)}}$$

$$\omega_n = \sqrt{\frac{K_{vco}I_{cpi}}{2\pi N(C_1 + 2C_2)}}$$

$$\omega_{-3dB} \approx \frac{k_{vco}I_{cpp}T_{ref}}{2\pi N(C_1 + C_2)}$$

Mixed signal simulation results of the loop transfer function are in good agreement with linear mode prediction.

Figure 8:
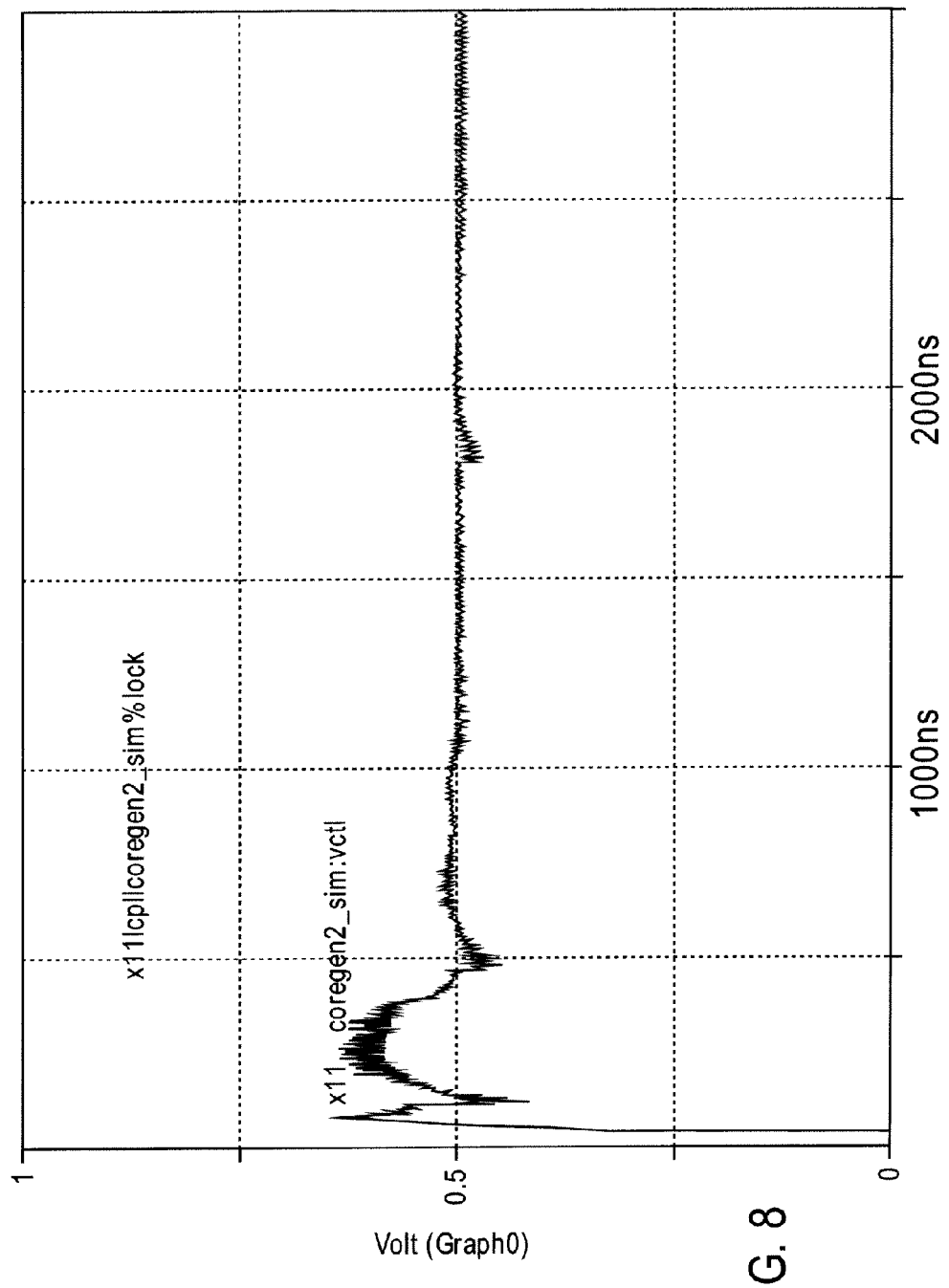
FIG. 8 is a graph of voltage versus time for a full-loop simulation of an LC phase lock loop circuit employing an embodiment of a digitally switched capacitor loop filter.

FIG. 8 shows a full loop simulation of an embodiment of a phase lock loop circuit 100 that includes a digitally switched capacitor loop filter 20. For the simulation shown in FIG. 8, which plots voltage versus time, and plots the control voltage Vct1 and the lock detector output, the results show that the phase lock loop circuit 100 locks within 1 microsecond, and that the ripple on the control voltage Vct1 after the lock condition is approximately 2 millivolts. After the loop was locked, a 100 picosecond phase step was applied to the reference clock input at time=1800 nanoseconds. The phase step response of the circuit 100 at the feedback clock fbclk shows that the damping factor is approximately 1, in agreement with linear model prediction.

The switched capacitor loop filter 20 of an embodiment of the invention has better jitter performance than a prior art design, mainly due to the reduced thermal noise given that a unity gain buffer, which contributes to thermal noise, is not needed for switched capacitor loop filter 20.

The switched capacitor loop filter 20 and the phase lock loop circuitry 100 employing the switched capacitor loop filter 20 can be used in various types of integrated circuits, including high-speed communication chips, microprocessors, and systems on a chip ("SOC").

Figure 9:
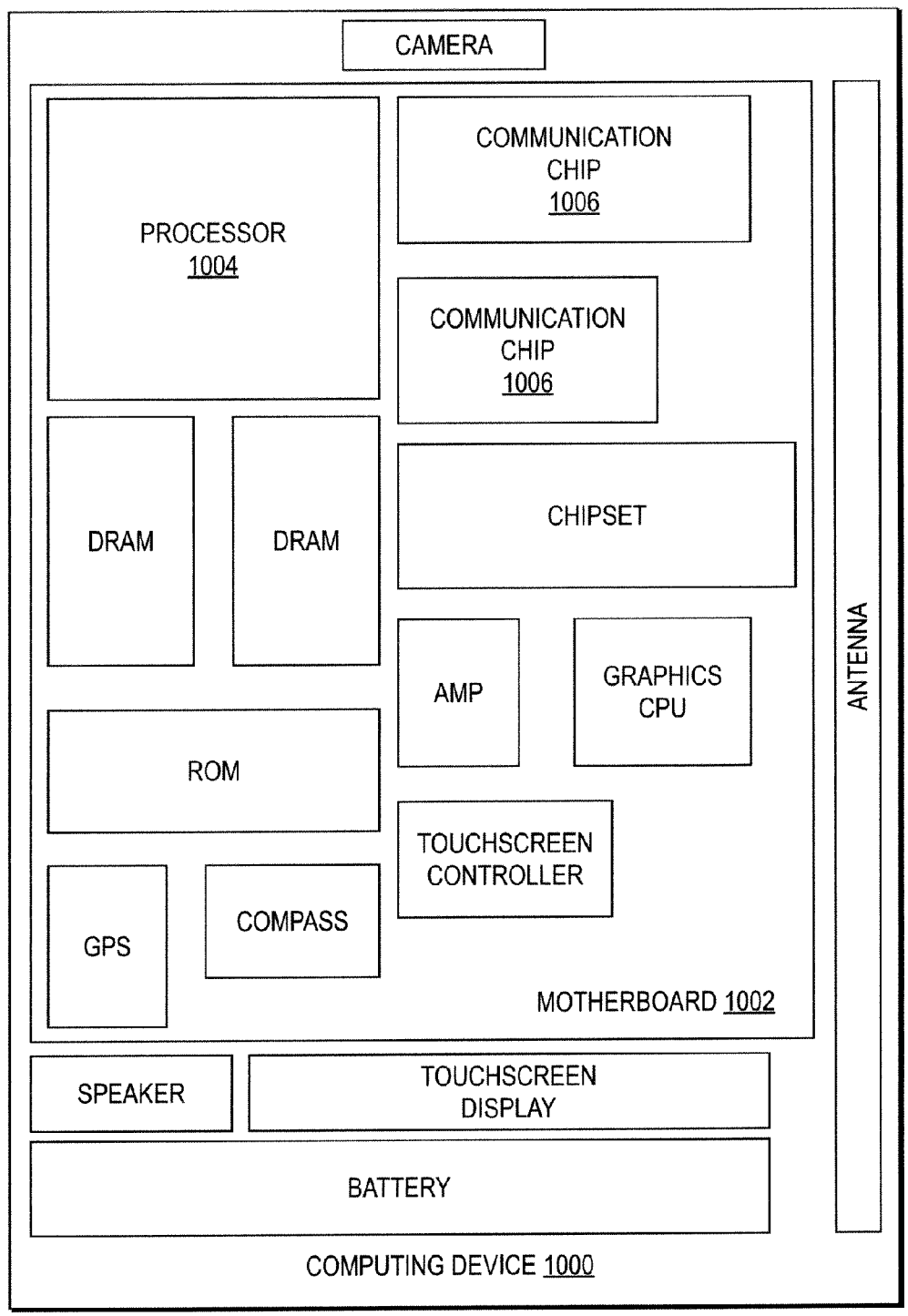
FIG. 9 illustrates an embodiment of a computing device that includes an embodiment of a digitally switched capacitor loop filter.

FIG. 9 illustrates examples of various devices which may employ the switched capacitor loop filter 20 and the phase lock loop circuitry 100. FIG. 9 illustrates a computing device 1000 in accordance with one implementation of the invention.

The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of the invention, the integrated circuit die of the processor includes one or more devices, such as transistors or metal interconnects, that are formed in accordance with implementations of the invention to form phase lock loop circuitry 100 and a switched capacitor loop filter 20. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In accordance with another implementation of the invention, the integrated circuit die of the communication chip includes one or more devices, such as transistors or metal interconnects, that are formed in accordance with implementations of the invention to form phase lock loop circuitry 100 and a switched capacitor loop filter 20.

In further implementations, another component housed within the computing device 1000 may contain an integrated circuit die that includes one or more devices, such as transistors or metal interconnects, that are formed in accordance with implementations of the invention to form phase lock loop circuitry 100 and a switched capacitor loop filter 20.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

In the foregoing specification, reference has been made to specific embodiments of the invention. It will, however, be evident that various modifications and changes may be made thereto without departing from the broader spirit and scope of the invention. The specification and drawings are, accordingly, to be regarded in an illustrative rather than a restrictive sense.

What is claimed is:

1. A loop filter comprising:
a first loop filter input;
a second loop filter input;
a loop filter output coupled to the first loop filter input;
a loop filter capacitor coupled to the loop filter output and the first loop filter input;
sample switches coupled to the second loop filter input;
a voltage divider;
reset switches coupled to the voltage divider; and
switched capacitors coupled to the signal switches, the reset switches, the loop filter capacitor, and the loop filter output.

2. The loop filter of claim 1, wherein the voltage divider comprises a resistive divider circuit that generates a reset direct current (DC) voltage.

3. The loop filter of claim 2, wherein the reset DC voltage is substantially one half of a supply voltage.

4. The loop filter of claim 2, wherein the reset DC voltage from the resistive divider circuit periodically resets the switched capacitors via the reset switches one switched capacitor at a time.

5. The loop filter of claim 1, wherein the second loop filter input is applied to the switched capacitors via the sample switches one switched capacitor at a time.

6. The loop filter of claim 1, wherein the first loop filter input is supplied by an integral charge pump and the second loop filter input is supplied by a proportional charge pump.

7. The loop filter of claim 6, wherein the integral charge pump and the proportional charge pump receive signals from a phase frequency detector and wherein the loop filter output controls a voltage-controlled oscillator.

8. The loop filter of claim 6,
wherein the sample switches comprise:
a first sample switch including a first end coupled to the output of the proportional charge pump;
a second sample switch including a first end coupled to the output of the proportional charge pump;
wherein the reset switches comprise:
a first reset switch including a first end coupled to the voltage divider;
a second reset switch including a first end coupled to the voltage divider;
wherein switched capacitors comprise:
a first switched capacitor including (1) a first end coupled to (a) a second end of the first sample switch and (b) a second end of the first reset switch and (2) a second end coupled to the loop filter capacitor;
a second switched capacitor including (1) a first end coupled to (a) a second end of the second sample switch and (b) a second end of the second reset switch and (2) a second end coupled to the loop filter capacitor.

9. A phase lock loop comprising:
a phase frequency detector;
a first charge pump coupled to outputs of the phase frequency detector;
a second charge pump coupled to the outputs of the phase frequency detector;
a digitally switched loop filter comprising:
a loop filter capacitor;
digitally controlled sample switches coupled to an output of the second charge pump;
a voltage divider;
digitally controlled reset switches coupled to the voltage divider;
switched capacitors coupled to the sample switches, the reset switches, and the loop filter capacitor; and
a voltage-controlled oscillator including an input coupled to the loop filter capacitor, the switched capacitors, and an output of the first charge pump.

10. The phase lock loop of claim 9, wherein the voltage divider comprises a resistive divider that generates a reset voltage.

11. The phase lock loop of claim 10,
wherein a signal from the output of the second charge pump is applied to the switched capacitors via the sample switches one switch capacitor at a time; and
wherein the reset voltage from the resistive divider periodically resets the switched capacitors via the reset switches one switched capacitor at a time.

12. The phase lock loop of claim 9, wherein the first charge pump is an integral charge pump and the second charge pump is a proportional charge pump.

13. The phase lock loop of claim 9,
wherein the sample switches comprise:
a first sample switch including a first end coupled to the output of the second charge pump;
a second sample switch including a first end coupled to the output of the second charge pump;
wherein the reset switches comprise:
a first reset switch including a first end coupled to the voltage divider;
a second reset switch including a first end coupled to the voltage divider;
wherein switched capacitors comprise:
a first switched capacitor including (1) a first end coupled to (a) a second end of the first sample switch and (b) a second end of the first reset switch and (2) a second end coupled to the loop filter capacitor;
a second switched capacitor including (1) a first end coupled to (a) a second end of the second sample switch and (b) a second end of the second reset switch and (2) a second end coupled to the loop filter capacitor.

14. A method of filtering comprising:
providing inputs to first and second charge pumps;
charging a loop filter capacitor directly from the first charge pump;
charging the loop filter capacitor through two alternatively switched capacitors from the second charge pump;
alternatively resetting the two switched capacitors to a voltage supplied by a voltage divider;
providing a filtered output from the first charge pump, the loop filter capacitor, and the two switched capacitors.

15. The method of filtering of claim 14, further comprising:
supplying a reference clock and a feedback clock as inputs to a phase frequency detector;
supplying up and down pulses generated by the phase frequency detector as the inputs to the first and second charge pumps.

16. The method of filtering of claim 14, further comprising:
supplying the filtered output to a voltage-controlled oscillator.

17. The method of filtering of claim 14, wherein the voltage divider comprises a resistive divider that generates a reset voltage that is supplied alternatively to the two switched capacitors via reset switches.

18. The method of filtering of claim 14, wherein the first charge pump generates an integral signal that is supplied to the loop filter capacitor and wherein the second charge pump generates a proportional signal that is supplied alternatively to the two switched capacitors via sample switches.

* * * * *